(12) United States Patent
Wang

(10) Patent No.: US 8,228,734 B2
(45) Date of Patent: Jul. 24, 2012

(54) NONVOLATILE MEMORY DEVICE AND METHOD OF PROGRAMMING THE SAME

(75) Inventor: In Soo Wang, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 207 days.

(21) Appl. No.: 12/650,924

(22) Filed: Dec. 31, 2009

(65) Prior Publication Data

US 2010/0302853 A1    Dec. 2, 2010

(30) Foreign Application Priority Data

May 29, 2009   (KR) .................. 10-2009-0047827

(51) Int. Cl.
*G11C 11/34* (2006.01)
(52) U.S. Cl. .............................. 365/185.13; 365/185.24
(58) Field of Classification Search ............. 365/185.13, 365/185.24
See application file for complete search history.

(56) References Cited

U.S. PATENT DOCUMENTS

| | | | | |
|---|---|---|---|---|
| 5,991,198 | A * | 11/1999 | Song et al. | 365/185.11 |
| 7,301,850 | B1 * | 11/2007 | Proebsting | 365/230.06 |
| 7,656,710 | B1 * | 2/2010 | Wong | 365/185.19 |
| 2007/0234144 | A1 * | 10/2007 | Gongwer et al. | 714/718 |
| 2008/0298124 | A1 * | 12/2008 | Wong | 365/185.03 |
| 2009/0147573 | A1 * | 6/2009 | Hemink | 365/185.03 |

FOREIGN PATENT DOCUMENTS

KR   1020080113919   12/2008

OTHER PUBLICATIONS

Notice of Allowance issued from Korean Intellectual Property Office on Feb. 7, 2011.

* cited by examiner

*Primary Examiner* — Michael Tran
(74) *Attorney, Agent, or Firm* — IP & T Group LLP

(57) ABSTRACT

A nonvolatile memory device includes a high voltage generation unit configured to generate a program voltage and a pass voltage, a block selection unit coupled to the high voltage generation unit through global word lines, a memory cell array coupled to the block selection unit through word lines, a discharge unit coupled to the global word lines and configured to change a level of voltage supplied to the global word lines, and a discharge control unit configured to generate a discharge signal, and transfer the discharge signal to the discharge unit in response to the program voltage.

11 Claims, 3 Drawing Sheets

NONVOLATILE MEMORY DEVICE AND METHOD OF PROGRAMMING THE SAME

CROSS-REFERENCE TO RELATED APPLICATION

Priority to Korean patent application number 10-2009-0047827 filed on May 29, 2009, the entire disclosure of which is incorporated by reference herein, is claimed.

BACKGROUND

Exemplary embodiments relate to a nonvolatile memory device and a method of programming the same and, more particularly, to a nonvolatile memory device and a method of programming the same, which are capable of improving a distribution of the threshold voltages of memory cells.

The program operation of a nonvolatile memory device is performed to raise the threshold voltage of a selected memory cell by supplying a program voltage to a word line coupled to the selected memory cell.

In single level cells (SLCs) having a single level, a threshold voltage period is divided into two periods—an erase state and a program state. In such a threshold voltage period, reliability of the device is not greatly affected because the interval (or margin) between a distribution of the threshold voltages of cells being in the erase state and a distribution of the threshold voltages of cells being in the program state is not great.

Multi-level cells (MLCs) having multiple levels and having a number of distributions of the threshold voltages have recently been developed. Therefore, it becomes an important issue to secure the margin between different distributions of the threshold voltages of the cells.

FIG. 1 is a timing diagram illustrating a known program operation. This figure shows voltages supplied to a selected word line Sel.WL coupled to a selected memory cell. A program operation using, for example, an incremental step pulse program (ISPP) method is described below.

In the program operation, a distribution of the threshold voltage of the selected memory cell may be widened because periods T1, T3, and T5 in which program voltages Vpass are supplied, and periods T2 and T4 in which verification operations are performed, are repeatedly performed. For example, during the period T1, the pass voltage Vpass is first supplied to the selected word line Sel.WL, and then a program start voltage V1 is supplied. Here, the period T1 is continued during a time D1. Next, during the period T2, a program verification operation is performed by supplying a verification voltage Vr to the selected word line Sel.WL. If, as a result of the program verification operation, the program operation has not been completed, a program voltage V2 having a higher level than the voltage V1 supplied in the period T1 is supplied to the selected word line Sel.WL during the period T3. The period T3 is continued during a time D2. In this manner, the program voltage having a gradually rising level is supplied to the selected word line Sel.WL until the program operation is completed (within a critical number of times). The program verification operation is performed between the periods in which the program voltages are applied. Here, the times D1, D2, and D3 during which the program voltages are supplied have the same duration (i.e., D1=D2=D3).

FIG. 2 is a graph illustrating known distributions of the threshold voltages of memory cells.

It is preferred that a number of memory cells included in the same memory chip have the same operation (program or erase) speed. However, the operation speeds of actual memory cells are slightly different. For example, in the case in which a specific memory cell of the memory cells has a faster operation speed than the remaining memory cells, the threshold voltage of the specific memory cell can be raised to a desired voltage level although a program voltage having a low voltage level is supplied to the specific memory cell. Here, since the threshold voltages of the remaining memory cells have to be raised, the program voltage is supplied to all the memory cells several times by gradually raising the level of the program voltage supplied to the memory cells. This method is called an ISPP method. As described above, the program voltage continues to be supplied to the specific memory cell having a faster operation speed than the remaining memory cells. Accordingly, a distribution of the threshold voltages of the memory cells can be increased (indicated by 'W' in FIG. 2). In particular, in the case of MLCs, reliability of the device can be deteriorated according to a reduction in the interval (or margin) between distributions of the threshold voltages of the cells.

BRIEF SUMMARY

Exemplary embodiments relate to a nonvolatile memory device and a method of programming the same, which are capable of, when a program operation using an ISPP method is performed, prohibiting an increase or widening in the distribution of the threshold voltages of memory cells by shortening the time during which a program voltage is supplied according to a rise in the program voltage.

A nonvolatile memory device according to an aspect of the present disclosure includes a high voltage generation unit configured to generate a program voltage and a pass voltage, a block selection unit coupled to the high voltage generation unit through global word lines, a memory cell array coupled to the block selection unit through word lines, a discharge unit coupled to the global word lines and configured to change a level of voltage supplied to the global word lines, and a discharge control unit configured to generate a discharge signal, and transfer the discharge signal to the discharge unit in response to the program voltage.

The discharge unit may include a number of discharge elements coupled between a ground voltage terminal and the global word lines, respectively. The discharge elements may operate in response to the discharge signal. Further, each of the discharge elements may be implemented using an NMOS transistor.

The block selection unit may include switching elements coupled between the word lines and the global word lines, respectively.

A method of programming a nonvolatile memory device according to another aspect of the present disclosure includes performing a program operation using an increasing step pulse program (ISPP) method. Here, a time duration during which a program voltage is supplied to selected memory cells is gradually reduced according to a rise in a level of the program voltage.

The program operation using the ISPP method may be performed within a critical number of times by repeatedly supplying the program voltage to the selected memory cells and verifying threshold voltages of the selected memory cells, until the threshold voltages of the selected memory cells have a voltage level of a verification voltage or higher.

The program voltage may be sequentially raised according to an increase in a number of times that the program voltage is supplied to the selected memory cells and that the threshold voltages of the selected memory cells are verified.

A method of programming a nonvolatile memory device according to yet another aspect of the present disclosure includes supplying an $(n-1)^{th}$ program voltage to a selected word line during an $(n-1)^{th}$ time period, performing an $(n-1)^{th}$ verification operation, and if a result of the verification operation is a failure, supplying an $n^{th}$ program voltage, having a higher voltage level than the $(n-1)^{th}$ program voltage, to the selected word line during an $n^{th}$ time period shorter than the $(n-1)^{th}$ time period, where n is a natural number.

The supplying of the $(n-1)^{th}$ or $n^{th}$ program voltage to the selected word line may include supplying a pass voltage to all word lines, including the selected word line, and then supplying the $(n-1)^{th}$ or $n^{th}$ program voltage to the selected word line.

A method of programming a nonvolatile memory device according to further yet another aspect of the present disclosure includes a program voltage supply period in which a program operation is performed on selected memory cells and a verification period in which a verification operation is performed on the selected memory cells. In this case, if a result of the verification operation in the verification period is a pass, the program operation is completed, and if the result of the verification operation in the verification period is a failure, the program voltage supply period and the verification period are repeatedly performed, until the program operation on the selected memory cells is completed, wherein the program voltage supply period is shorter than a previous program voltage supply period.

The level of the program voltage may be raised according to an increase in a number of times of the program voltage supply period.

The method may further include supplying a pass voltage to all word lines, including a word line coupled to the selected memory cells, before supplying the program voltage to the selected memory cells.

Further, a duration of the program voltage supply period may be controlled by discharging a word line to which the program voltage is supplied.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
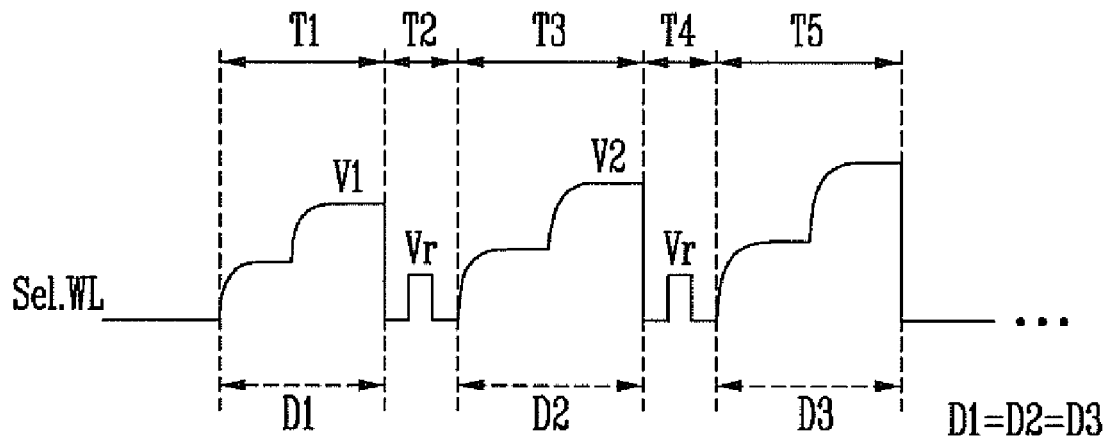
FIG. 1 is a timing diagram illustrating a known program operation.
Figure 2:
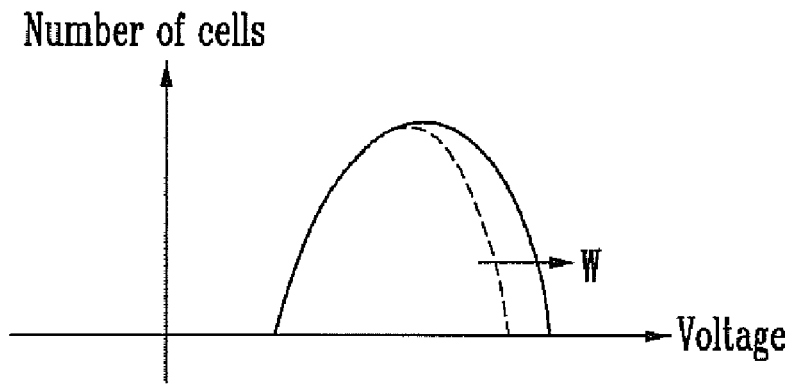
FIG. 2 is a graph illustrating known distributions of the threshold voltages of memory cells.
Figure 3:
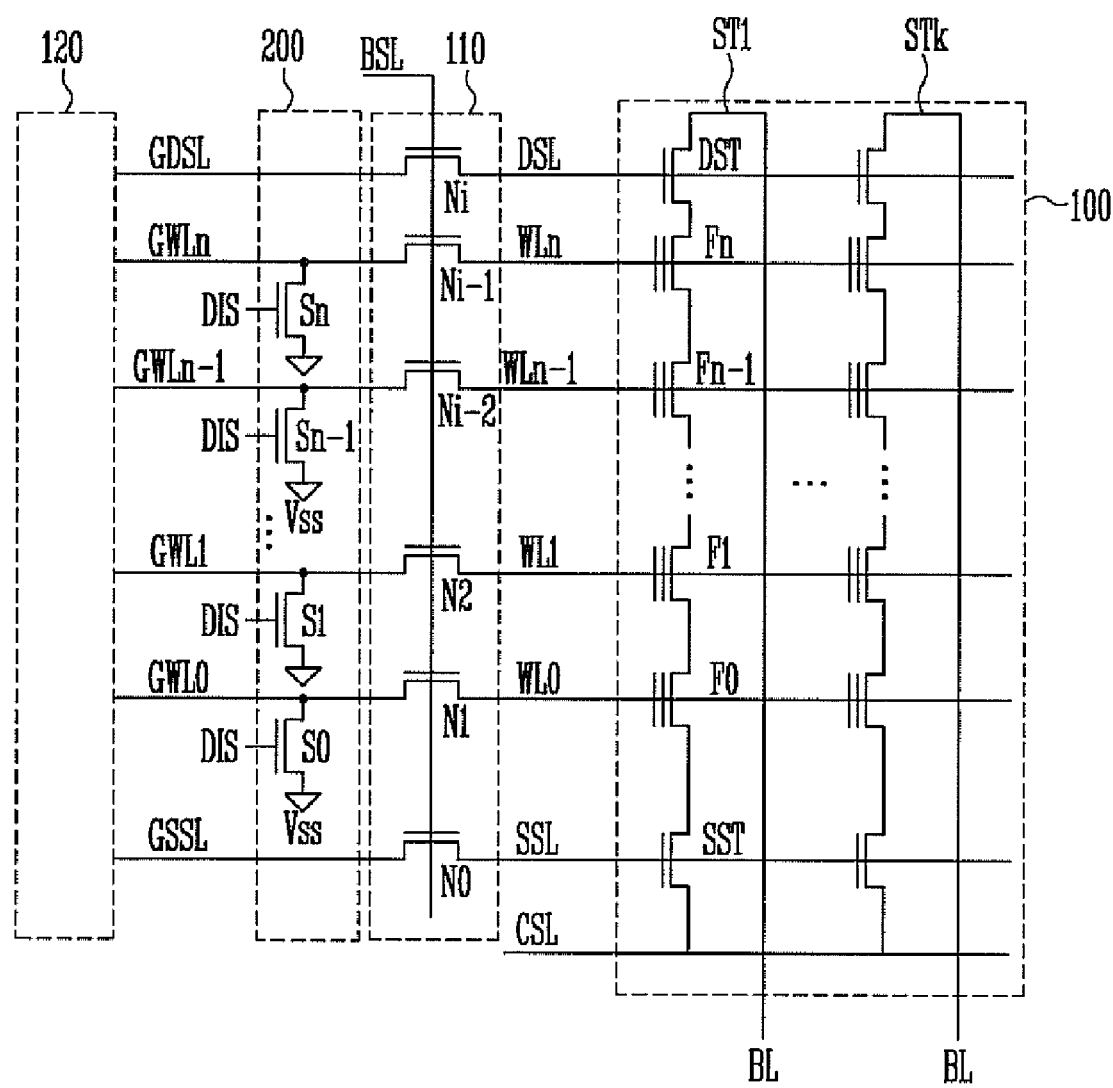
FIG. 3 is a circuit diagram of a nonvolatile memory device according to a present disclosure.

FIG. 3 is a circuit diagram of a nonvolatile memory device according to a present disclosure.

Referring to FIG. 3, the nonvolatile memory device includes a memory cell array 100 configured to include a number of memory blocks, a block selection unit 110 configured to select a memory block, a high voltage generation unit 120 configured to generate voltages to word lines, a discharge unit 200 configured to change the level of voltage supplied to global word lines, and a discharge control unit (not shown) configured to control the operation of the discharge unit 200.

The high voltage generation unit 120 is configured to output operation signals to a global drain selection line GDSL, global word lines GWL0 to GWLn, and a global source selection line GSSL. For example, the high voltage generation unit 120 outputs a turn-on or turn-off voltage to the global drain selection line GDSL and the global source selection line GSSL, and outputs a pass voltage Vpass, a program voltage Vpgm, or a driving voltage for each operation (e.g., a program operation, an erase operation, and a read operation) to each of the global word lines GWL0 to GWLn.

The block selection unit 110 includes a number of switch elements N0 to Ni. The switch elements N0 to Ni are coupled between the global drain selection line GDSL and a drain selection line DSL, between the global word lines GWL0 to GWLn and the word lines WL0 to WLn, and between the global source selection line GSSL and a source selection line SSL. Further, the switch elements N0 to Ni operate in response to voltage supplied to a block selection signal BSL.

Each of the memory blocks included in the memory cell array 100 includes a number of strings ST1 to STk. Each of the strings includes a number of memory cells F0 to Fn coupled in series together. A drain select transistor DST is coupled to the drain terminal of each string, and a source select transistor SST is coupled to the source terminal of each string. A bit line BL is coupled to the drain of the drain select transistor DST, and a common source line CSL is coupled to the source of the source select transistor SST. Moreover, the gates of the drain select transistors DST are coupled to the drain selection line DSL, and the gates of the source select transistors SST are coupled to the source selection line SSL. Furthermore, the gates of the memory cells F0 to Fn are coupled to a number of the word lines WL0 to WLn, respectively.

The discharge unit 200 includes discharge elements S0 to Sn coupled between the respective global word lines GWL0 to GWLn and a terminal for a ground voltage Vss. The discharge elements S0 to Sn have drains coupled to the respective global word lines GWL0 to GWLn and sources coupled to the terminal for a ground voltage Vss. Furthermore, the discharge elements S0 to Sn are operated in response to a discharge signal DIS supplied to their gates. Here, for example, each of the discharge elements S0 to Sn can be implemented using an NMOS transistor.

In additional exemplary embodiments, the discharge elements S0 to Sn of the discharge unit 200 may be coupled to the respective word lines WL0 to WLn, as opposed to the respective global word lines GWL0 to GWLn.

The discharge control unit (not shown) is configured to output the discharge signal DIS in response to a program operation, thereby controlling the discharge unit 200. For example, in the case in which a program operation using an ISPP method is performed, when a program voltage Vpgm is generated, the discharge control unit can output the discharge signal DIS of a high level after a lapse of a certain time during which a specific memory cell can be programmed. In particular, with a rise in the level of the program voltage Vpgm, the time that it takes to generate the discharge signal DIS is shortened. Accordingly, the level of the voltage supplied to the global word lines GWL0 to GWLn is lowered in order to reduce the time during which the program voltage Vpgm is supplied to a selected memory cell.

Figure 4:
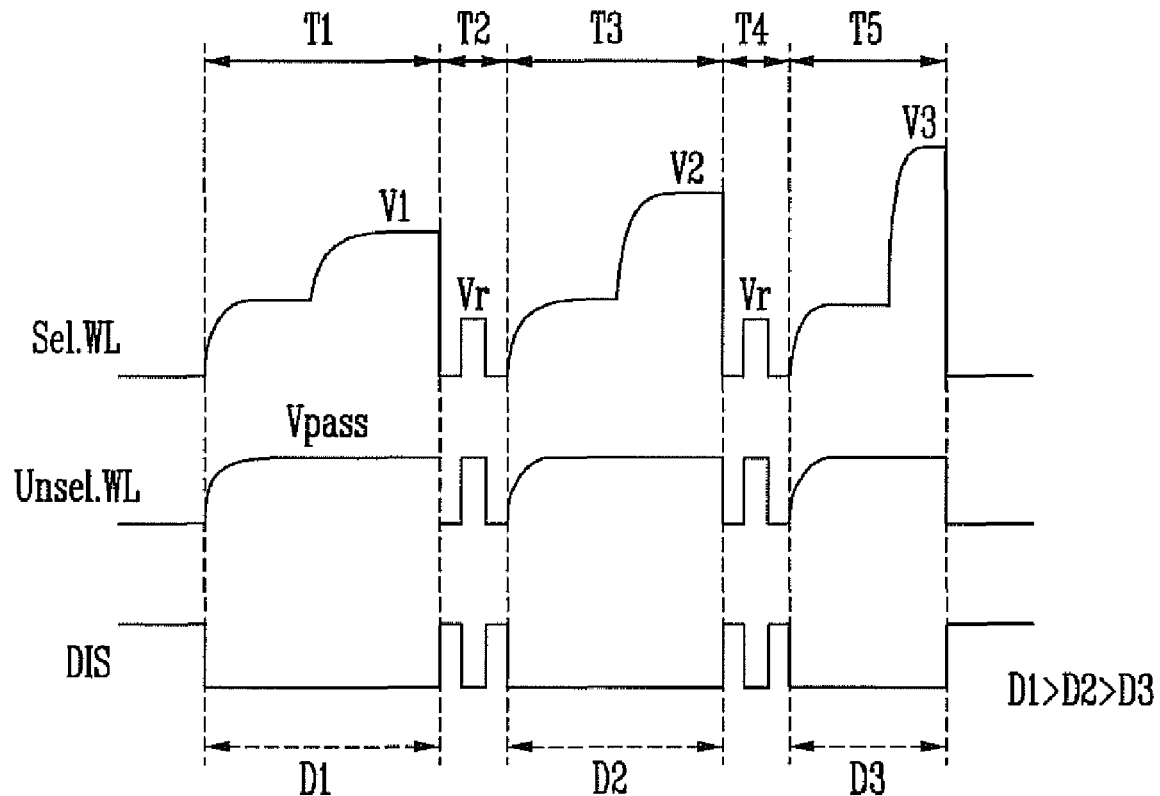
FIG. 4 is a timing diagram illustrating a program operation according to a present disclosure.

FIG. 4 is a timing diagram illustrating a program operation according to a present disclosure.

A program operation using an ISPP method, from among several program operations of a nonvolatile memory device, is described below.

In the program operation using an ISPP method, an operation for supplying a program voltage and a verification operation can be repeatedly performed until the verification operation is completed. A part of a period in which the program operation is performed is described below.

The program operation period includes a period T1 in which a first program voltage is supplied, a first verification period T2, a period T3 in which a second program voltage is supplied, a second verification period T4, and a period T5 in which a third program voltage is supplied. Here, as described above, the program voltage supply period and the verification period can be repeatedly performed N times (where N is a natural number). Whenever each period is repeated, the level of the program voltage is preferably raised.

In more detail, when the period T1 in which the first program voltage is supplied is a first period in which a program voltage is supplied, a program pass voltage Vpass is supplied to a selected word line Sel.WL (e.g., WL1 in FIG. 3) and the remaining word lines Unsel.WL (e.g., WL0 and WL2 to WLn in FIG. 3). At this time, the discharge signal DIS of a low logic level is supplied to the gates of the discharge elements S0 to Sn, thereby turning off all the discharge elements S0 to Sn. Next, the program operation is performed on selected memory cells coupled to the selected word line Sel.WL by supplying the first program voltage V1 to the selected word line Sel.WL. Here, the first program voltage V1 can become a program start voltage. The first program voltage V1 is supplied during a time D1.

In the first verification period T2, the threshold voltages of the selected memory cells, which may have shifted after the period T1, are verified. If, as a result of the verification, the threshold voltages of the selected memory cells are more than a verification voltage Vr, the program operation is completed. If, as a result of the verification, memory cells having threshold voltages less than the verification voltage exist, a next program operation is performed.

In more detail, in the first verification period T2, when the discharge elements S0 to Sn are turned on, the global word lines GWL0 to GWLn are coupled to the terminal for the ground voltage Vss, and therefore, are discharged. Accordingly, the voltage levels of the word lines WL0 to WLn shift to a low voltage level. Next, the program verification operation is performed. The program verification operation is performed with the discharge signal DIS of a low logic level supplied to the discharge elements S0 to Sn, and the verification voltage Vr supplied to the selected word line Sel.WL. At this time, the pass voltage Vpass is supplied to the remaining word lines Unsel.WL. If the threshold voltages of the selected memory cells have a voltage level equivalent to the verification voltage or higher (i.e., a result of the verification operation is a pass), the program operation is completed. However, if a result of the verification operation is a failure, a next program operation is performed. Furthermore, during the period in which the verification voltage Vr is supplied to the selected word line Sel.WL, the discharge signal DIS of a low logic level is supplied to the discharge elements S0 to Sn in order to prevent the word lines WL0 to WLn from being discharged.

In the period T3 in which the second program voltage is supplied, the pass voltage Vpass is supplied both to the selected word line Sel.WL and the unselected word lines Unsel.WL. Next, the second program voltage V2 having a higher voltage level than the first program voltage V1 is supplied to the selected word line Sel.WL. In particular, in the period T3, to supply the second program voltage V2 to the selected word line Sel.WL during a time shorter than the time during which the first program voltage V1 has been supplied, the discharge signal DIS of a low logic level is supplied to the discharge elements S0 to Sn during a time D2 shorter than the time D1. That is, when the discharge signal DIS of a low logic level is supplied to the discharge elements S0 to Sn during the time D2 shorter than the time D1, the time taken for the threshold voltages of the selected memory cells to be changed is also shortened. Accordingly, the threshold voltage of a memory cell having a fast operation speed can be prevented from rising.

In the second verification period T4, a verification operation is performed in the same manner as that of the first verification period T2.

If, as a result of the verification operation, the verification operation is a failure, a next program operation is performed.

In the period T5 in which the third program voltage is supplied, the pass voltage Vpass is supplied to both the selected word line Sel.WL and the unselected word lines Unsel.WL. In other words, in the case in which the second program voltage V2 has a higher voltage level than the first program voltage V1, if the second program voltage V2 is supplied for the same duration as that in which the first program voltage V1 is supplied, a distribution of the threshold voltages of the selected memory cells may be increased. In this case, as described above, if the discharge signal DIS of a low logic level is supplied during the time D3 shorter than the time D2, the time taken for the threshold voltages of the selected memory cells to be changed is also shortened. Accordingly, the threshold voltage of a memory cell having a fast operation speed can be prevented from rising.

In particular, in the period T5, after the supply of the pass voltage Vpass, the third program voltage V3 is supplied to the selected word line Sel.WL. The third program voltage V3 has a higher voltage level than the second program voltage V2. For this reason, the discharge signal DIS maintains a low logic level during a time D3 shorter than the time D2, before shifting to a high logic level. Accordingly, the time during which the third program voltage V3 is supplied to the selected word line Sel.WL can be shortened.

In the periods T1, T3, and T5 in which the program voltages are supplied to the selected word line Sel.WL, the times during which the pass voltage Vpass is supplied to the word lines have the same duration. However, the times during which the respective program voltages V1, V2, and V3 are supplied are gradually shortened.

In the case in which a program operation using an ISPP method is performed, if the time during which the discharge signal DIS of a low logic level is supplied to the discharge elements S0 to Sn is controlled according to an increase in the level of a program voltage, the program operation can be stopped. Accordingly, the time during which corresponding selected memory cells are programmed can be controlled.

Figure 5:
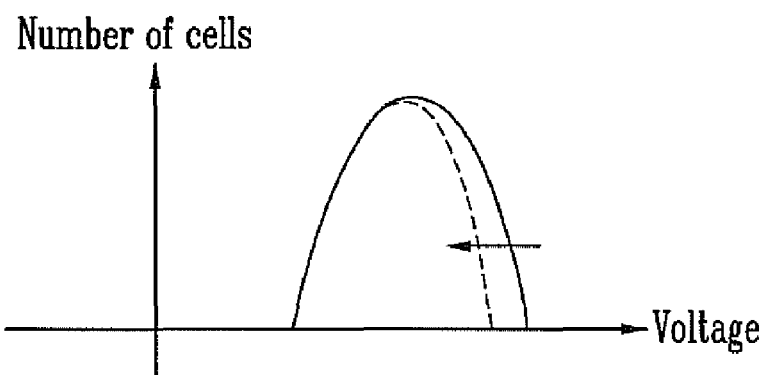
FIG. 5 is a graph illustrating distributions of the threshold voltages of memory cells according to a present disclosure.

FIG. 5 is a graph illustrating distributions of the threshold voltages of memory cells according to a present disclosure.

As shown in FIG. 5, a distribution of the threshold voltages of memory cells can be prohibited from rising or widening by controlling the time during which a program operation is performed as described above with reference to FIG. 4.

As described above, when a program operation is performed, a word line to which a program voltage is supplied is discharged in order to control the time during which the program operation is performed. Accordingly, a distribution of the threshold voltages of corresponding memory cells can be prohibited from rising or widening. Furthermore, since the time during which the program voltage is supplied to the word line is shortened, the time that it takes to perform the program operation can be reduced. In particular, in the case of MLCs, reliability of a nonvolatile memory device can be improved because the interval (or margin) between the threshold voltages of memory cells in different program periods can be secured.

According to the present disclosure, when a program operation using an ISPP method is performed, the time during which a program voltage is supplied is shortened according to a rise in the program voltage. Accordingly, an increase or widening in the distribution of the threshold voltages of memory cells can be prohibited, and thus, reliability of a nonvolatile memory device can be improved.

What is claimed is:

1. A nonvolatile memory device, comprising:
 a high voltage generation unit configured to generate a program voltage and a pass voltage;
 a block selection unit coupled to the high voltage generation unit through global word lines;
 a memory cell array coupled to the block selection unit through word lines;
 a discharge unit coupled to the global word lines and configured to change a level of voltage supplied to the global word lines; and
 a discharge control unit configured to generate a discharge signal, and transfer the discharge signal to the discharge unit in response to the program voltage.

2. The nonvolatile memory device of claim 1, wherein the discharge unit comprises a number of discharge elements coupled between a ground voltage terminal and the global word lines, respectively.

3. The nonvolatile memory device of claim 2, wherein the discharge elements operate in response to the discharge signal.

4. The nonvolatile memory device of claim 3, wherein each of the discharge elements is implemented using an NMOS transistor.

5. The nonvolatile memory device of claim 1, wherein the block selection unit comprises switching elements coupled between the word lines and the global word lines, respectively.

6. A method of programming a nonvolatile memory device, the method comprising:
 performing a program operation using an increasing step pulse program (ISPP) method, within a critical number of times by repeatedly supplying a program voltage to the selected word lines and verifying the memory cells, until the threshold voltages of the memory cells have a voltage level of a verification voltage or higher, wherein the program voltage is sequentially raised according to an increase in a number of times that the program voltage is supplied to the memory cells and that the threshold voltages of the memory cells are verified, and a time, during which the program voltage is supplied to the selected word line, is gradually decreased.

7. A method of programming a nonvolatile memory device, the method comprising:
 supplying an $(n-1)^{th}$ program voltage to a selected word line during an $(n-1)^{th}$ time period;
 performing an $(n-1)^{th}$ verification operation; and
 if a result of the verification operation is a failure, supplying an $n^{th}$ program voltage, having a higher voltage level than the $(n-1)^{th}$ program voltage, to the selected word line, wherein a time, during which the $n^{th}$ program voltage is supplied to the selected word line, is gradually decreased.

8. The method of claim 7, wherein the supplying of the $(n-1)^{th}$ or $n^{th}$ program voltage to the selected word line comprises supplying a pass voltage to all word lines, including the selected word line, and then supplying the $(n-1)^{th}$ or $n^{th}$ program voltage to the selected word line.

9. A method of programming a nonvolatile memory device, the method comprising:
 a pass voltage supply period in which a pass voltage is supplied to all word lines;
 a program voltage supply period in which a program operation is performed on selected memory cells; and
 a verification period in which a verification operation is performed on the selected memory cells, wherein if a result of the verification operation in the verification period is a pass, the program operation is completed, and if the result of the verification operation in the verification period is a failure, the program voltage supply period and the verification period are repeatedly performed, until the program operation on the selected memory cells is completed, wherein the program voltage supply period is shorter than a previous program voltage supply period.

10. The method of claim 9, wherein a level of the program voltage is raised according to an increase in a number of times of the program voltage supply period.

11. The method of claim 9, wherein a duration of the program voltage supply period is controlled by discharging a word line to which the program voltage is supplied.

* * * * *